United States Patent
Pradeep et al.

(10) Patent No.: US 6,281,093 B1
(45) Date of Patent: Aug. 28, 2001

(54) METHOD TO REDUCE TRENCH CONE FORMATION IN THE FABRICATION OF SHALLOW TRENCH ISOLATIONS

(75) Inventors: Yelehanka Ramachandramurthy Pradeep; Qinghua Zhong; Zheng Zou, all of Singapore (SG); Henry Gerung, Malang (ID)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/619,016

(22) Filed: Jul. 19, 2000

(51) Int. Cl.$^7$ .................................................. H01L 21/76
(52) U.S. Cl. ......................... 438/424; 438/296; 438/700
(58) Field of Search .................................. 438/424, 221, 438/42, 296, 359, 700

(56) References Cited

U.S. PATENT DOCUMENTS

| | | | |
|---|---|---|---|
| 4,534,824 | 8/1985 | Chen | 156/628 |
| 5,118,636 | 6/1992 | Hosaka | 437/35 |
| 5,668,044 | 9/1997 | Ohno | 438/433 |
| 5,780,353 | 7/1998 | Omid-Zohoor | 438/433 |
| 6,004,864 | 12/1999 | Huang et al. | 438/433 |

OTHER PUBLICATIONS

Stanley Wolf Silicon Processing for the VSLI ERA vol. 2 Lattice Press p. 52.*

\* cited by examiner

*Primary Examiner*—Charles Bowers
*Assistant Examiner*—David S. Blum
(74) *Attorney, Agent, or Firm*—George O. Saile; Rosemary L. S. Pike

(57) ABSTRACT

A new method of fabricating shallow trench isolations has been achieved. A silicon dioxide layer is formed overlying a semiconductor substrate. A silicon nitride layer is deposited overlying the silicon dioxide layer. The silicon nitride layer is patterned to expose the semiconductor substrate where shallow trench isolations are planned. Ions are implanted into the exposed semiconductor substrate. The implanting damages any passive surface materials overlying the semiconductor substrate. The exposed semiconductor substrate is etched down to form trenches. The damaged passive surface materials are removed during the etching down to thereby prevent trench cone formation. A trench filling layer is deposited to fill the trenches. The trench filling layer is polished down to complete the shallow trench isolations in the manufacture of the integrated circuit device.

20 Claims, 4 Drawing Sheets

METHOD TO REDUCE TRENCH CONE FORMATION IN THE FABRICATION OF SHALLOW TRENCH ISOLATIONS

BACKGROUND OF THE INVENTION (1) Field of the Invention

The invention relates to a method of fabricating semiconductor devices, and more particularly, to the reduction of trench cones in the fabrication of trenches in the manufacture of an integrated circuit device.

(2) Description of the Prior Art

The use of shallow trench isolation (STI) for the formation of integrated circuit isolations has grown in the art due to the reduced surface area and improved topology of STI when compared to traditional local oxidation of silicon (LOCOS) schemes. One problem that is encountered in the use of STI is the formation of trench cones during the trench etching process.

Referring to FIG. 1, a cross-section of a partially completed prior art integrated circuit is shown. A semiconductor substrate 10 is shown. A silicon dioxide, or pad oxide, layer 14 overlies the semiconductor substrate 10. A silicon nitride layer 18 overlies the silicon dioxide layer 14. The silicon nitride layer 18 and the silicon dioxide layer 14 are patterned to thereby expose the semiconductor substrate 10 where shallow trench isolations are planned. The silicon nitride layer 18 forms a hard mask for the subsequent trench etching.

Note that a residue of passive surface material 22 overlies the semiconductor substrate 10 after the patterning step. This passive surface material 22 may comprise silicon nitride or silicon dioxide residue that remains after the hard mask is etched. In addition, the passive surface material 22 may comprise native oxide or another material.

Referring now to FIG. 2, the trench for the STI is etched into the semiconductor substrate 10. The trench etching process uses the silicon nitride layer 18 as a hard mask. During the etching process, trench cones 26, also called silicon cones 26, are formed. The presence of the passive surface material 22 inhibits substrate etching and thereby causes the formation of these cones 26. The gases used in the dry etching process are not able to remove this passive surface material 22. The presence of the cones 26 within the trench is detrimental to the isolation performance of the STI.

Several prior art approaches disclose methods to form shallow trench isolation in the semiconductor substrate. U.S. Pat. No. 4,534,824 to Chen discloses a method to form STI with improved surface inversion immunity. The oxide-nitride-oxide layer overlying the substrate is patterned to expose the substrate where a trench is planned. Stop junctions are implanted into the substrate. The junctions are laterally diffused beyond the opening boundary by heat treatment. Sidewall spacers are formed on the oxide-nitride-oxide layer to narrow the opening. The substrate is then etched through the opening. The laterally diffused part of the stop junctions remains after the trench etch. U.S. Pat. No. 5,780,353 to Omid-Zohoor teaches a method to form STI with doped sidewalls. The silicon nitride layer overlying the substrate is patterned to expose the substrate where trenches are planned. Ions are implanted through the opening to form a junction. The junction is laterally diffused beyond the opening boundary by heat treatment. The trench is etched into the substrate. The doped junction rims the top of the trench. U.S. Pat. No. 5,118,636 to Hosaka discloses a method to form STI. The oxide layer overlying the substrate is patterned to expose the substrate. Ions are implanted through the opening to form a doped junction. An anneal is performed to laterally diffuse the doped junction beyond the opening boundary. The trench is etched into the substrate through the opening. The doped junction thereby surrounds the top of the trench. U.S. Pat. No. 5,668,044 to Ohno teaches a method to form STI. An insulator layer that overlies the substrate is patterned to expose the substrate where the trench is planned. Ions are implanted through the opening to form a doped junction. An anneal is performed to laterally-diffuse the junction beyond the opening boundary. The trench is etched through the opening and a stopping junction is thereby formed surrounding the top of the trench. U.S. Pat. No. 6,004,864 to Huang et al discloses a method to form STI. An insulator layer that overlies the substrate is patterned to expose the substrate where the trench is planned. Ions are implanted through the opening to form a heavily-doped junction in the substrate. A rapid thermal anneal (RTA) is performed to activate the implanted ions. An aqueous HF wet etch is performed to etch the trench. The presence of the heavily-doped junction greatly increases the wet etch rate of the substrate. The heavily-doped junction thereby facilitates wet etching the substrate to form the trench.

SUMMARY OF THE INVENTION

A principal object of the present invention is to provide an effective and very manufacturable method of reducing trench cones in the fabrication of trenches in the manufacture of integrated circuits.

A further object of the present invention is to provide a method to reduce the occurrence of trench cones by damaging the passive surface materials overlying the semiconductor substrate.

A yet further object of the present invention is to reduce the occurrence of trench cones by removing the damaged passive surface materials during the trench etch.

Another further object of the present invention is to provide a method to form trenches with fewer trench cones.

Another further object of the present invention is to provide a method to form shallow trench isolations with fewer trench cones.

In accordance with the objects of this invention, a new method of fabricating shallow trench isolations has been achieved. A silicon dioxide layer is formed overlying a semiconductor substrate. A silicon nitride layer is deposited overlying the silicon dioxide layer. The silicon nitride layer is patterned to expose the semiconductor substrate where shallow trench isolations are planned. Ions are implanted into the exposed semiconductor substrate. The implanting damages any passive surface materials overlying the semiconductor substrate. The exposed semiconductor substrate is etched down to form trenches. The damaged passive surface materials are removed during the etching down to thereby prevent trench cone formation. A trench filling layer is deposited to fill the trenches. The trench filling layer is polished down to complete the shallow trench isolations in the manufacture of the integrated circuit device.

BRIEF DESCRIPTION OF THE DRAWINGS

In the accompanying drawings forming a material part of this description, there is shown.

DESCRIPTION OF THE PREFERRED EMBODIMENTS

The method of the present invention is applied to the formation of a shallow trench isolation in a semiconductor substrate. In should be clear to those experienced in the art that the present invention can be applied and extended without deviating from the scope of the present invention.

Figure 1:
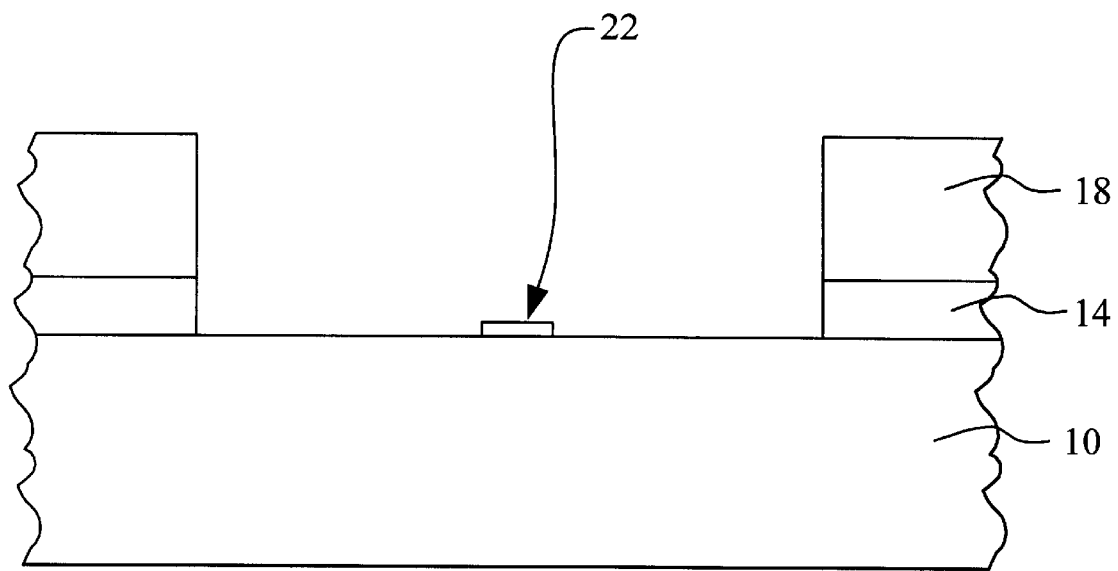
FIGS. 1 and 2 schematically illustrate in crosssection a partially completed prior art integrated circuit devices.
Figure 2:
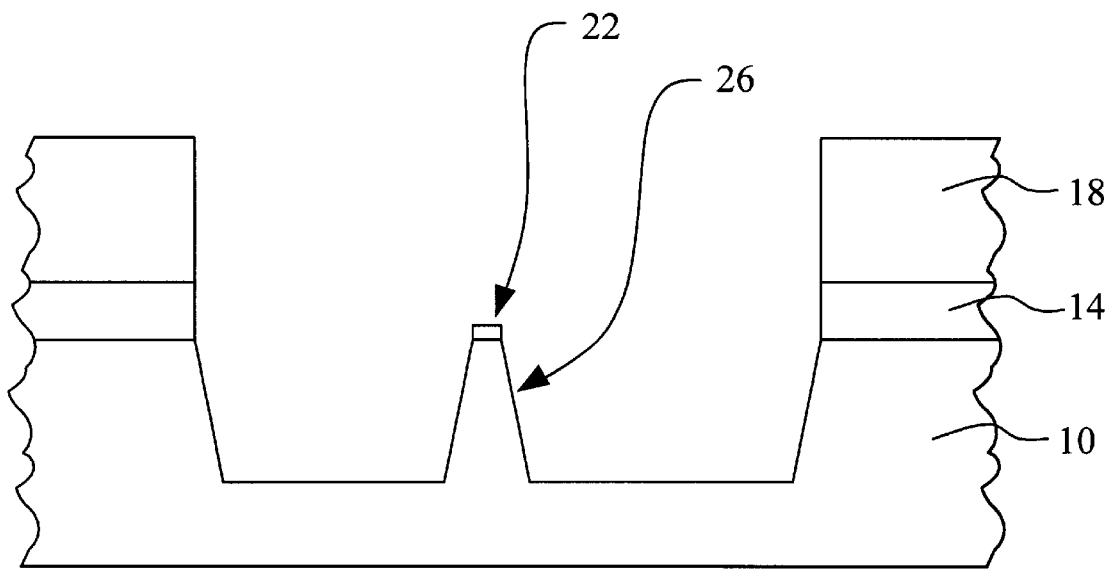
Figure 3:
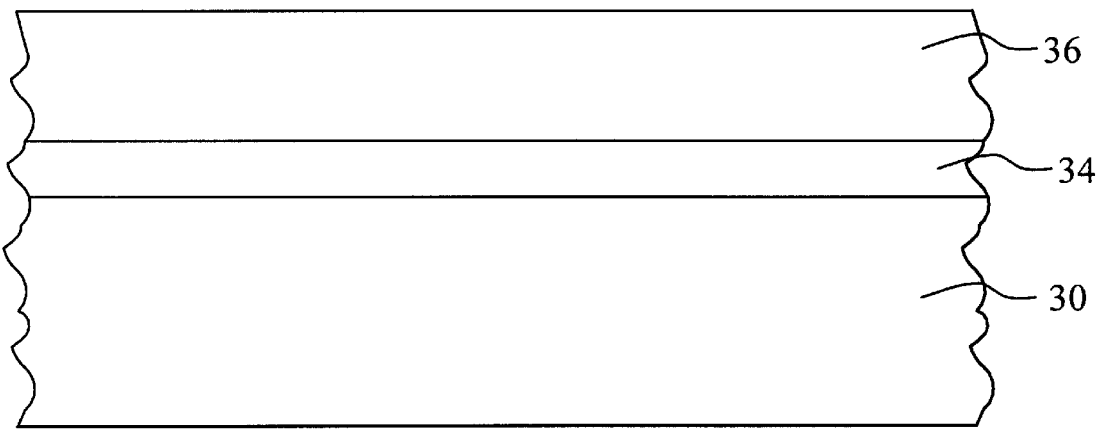
FIGS. 3 through 7 schematically illustrate in cross-sectional representation a preferred embodiment of the present invention.

Referring now more particularly to FIG. 3, there is illustrated a cross-section of a partially completed integrated circuit device of the preferred embodiment. A semiconductor substrate 30 is provided. Preferably, the semiconductor substrate 30 comprises monocrystalline silicon fabricated by methods well known in the art. A silicon dioxide layer 34 is formed overlying the semiconductor substrate 30. The silicon dioxide layer 34 is typically called the pad oxide layer and is used to improve the adhesion of the subsequently deposited silicon nitride layer. The silicon dioxide layer 34 is typically formed by thermal oxidation of the semiconductor substrate 30.

A silicon nitride layer 38 is deposited overlying the silicon dioxide layer 34. The silicon nitride layer 38 will serve as a hard mask during trench etching. The silicon nitride layer 38 may be deposited by, for example, a low-pressure chemical vapor deposition (LPCVD) process.

Figure 4:
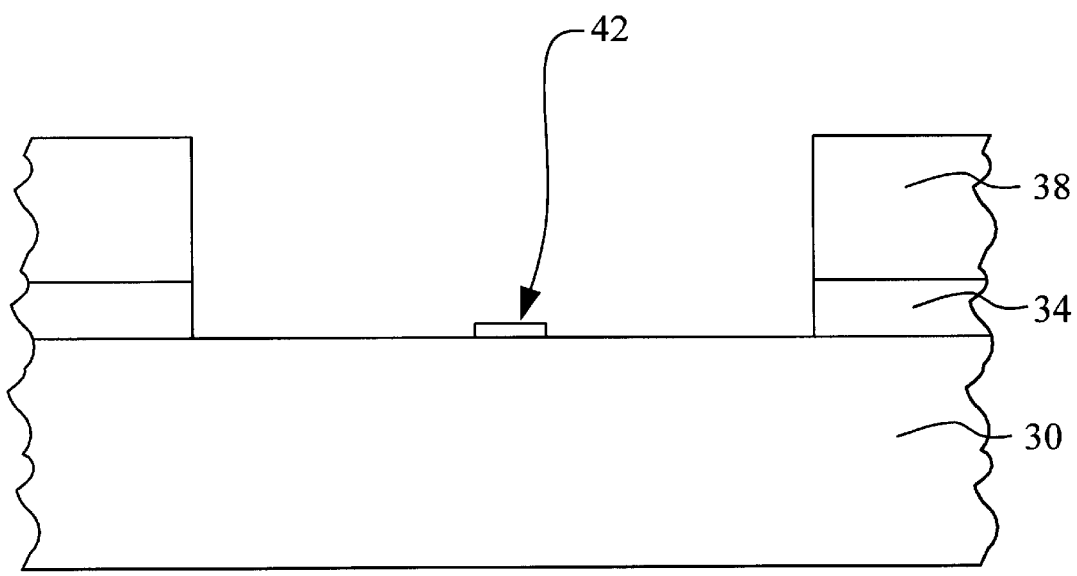

Referring now to FIG. 4, the silicon nitride layer 38 and the silicon dioxide layer 34 are patterned to expose the semiconductor substrate 30 where shallow trench isolations are planned. The patterning is accomplished by, for example, depositing a photoresist layer overlying the silicon nitride layer 38. The photoresist layer, not shown, would then be exposed to actinic light through a mask. After development, the silicon nitride layer 38 is exposed where trenches are planned. The silicon nitride layer 38 and the silicon dioxide layer 34 are then etched through using, for example, a plasma dry etch process. The silicon nitride layer 38 thereby forms a hard mask for the trench etching step. Finally, the remaining photoresist is stripped away.

Note that, as in the prior art example, passive surface material 42 is left on the surface of the semiconductor substrate 30. This passive surface material 42 may comprise silicon nitride or silicon dioxide that was not completely etched during the silicon nitride hard mask etch. Alternatively, the passive surface material 42 may comprise a native oxide layer on the substrate surface. Finally, the passive surface material may comprise some other passive material introduced onto the substrate surface during manufacturing. As noted in the prior art analysis, the presence of the passive surface material 42 will likely cause a trench cone to be formed because the trench etching process is not capable of removing the passive surface material 42.

Figure 5:
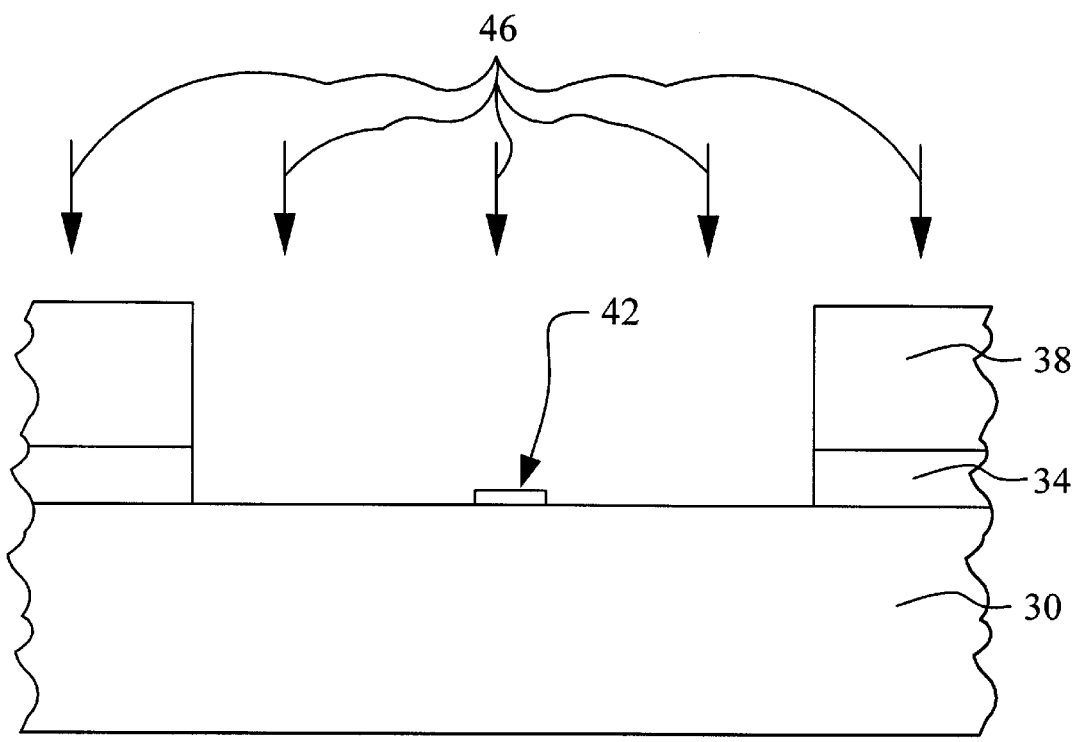

Referring now to FIG. 5, an important feature of the present invention is illustrated. Ions are implanted 42 into the exposed semiconductor substrate 30. The ion implantation 42 damages the passive surface material 42. The structure of the passive surface material 42 is broken, or made amorphous, by the ion bombardment 42. The result is a weakening of the passive surface material 42 to the point where it can be removed during the trench etching process.

To optimally damage the structure of the passive surface material 42, the ion implantation 46 is performed. It is not the purpose of the ion implantation 42 to create a doped junction in the semiconductor substrate 30. Rather, the purpose is only to sufficiently damage any passive surface material 42 overlying the semiconductor substrate. Various ion species may be used. The species may include those, such as phosphorous and boron, that can create either n-type or p-type junctions. However, other species, such as silicon or argon, that are not donor or acceptor ions, may be used. In addition, the ion implantation 42 may use a variety of dosages and energies.

Ion species that can be used in the implantation 42 include Si, Ar, Ne, Kr, P, As, B, or In. The implant energy is preferably between about 1 KeV and 700 KeV. The implant dose is preferably between about $1 \times 10^{12}$ atom/cm$^2$ and $1 \times 10^{16}$ atom/cm$^2$. The ion implantation 42 is preferably performed at an implantation angle of between about 0 degrees and 45 degrees with respect to the surface of the integrated circuit device. As an example, phosphorous ions can be implanted at a dose of about $2 \times 10^{13}$ atom/cm$^2$ and an energy of about 500 KeV. This novel ion bombardment sufficiently damages the passive surface material 42 to facilitate its removal during the trench etch and to thereby reduce the occurrence of trench cones.

Figure 6:
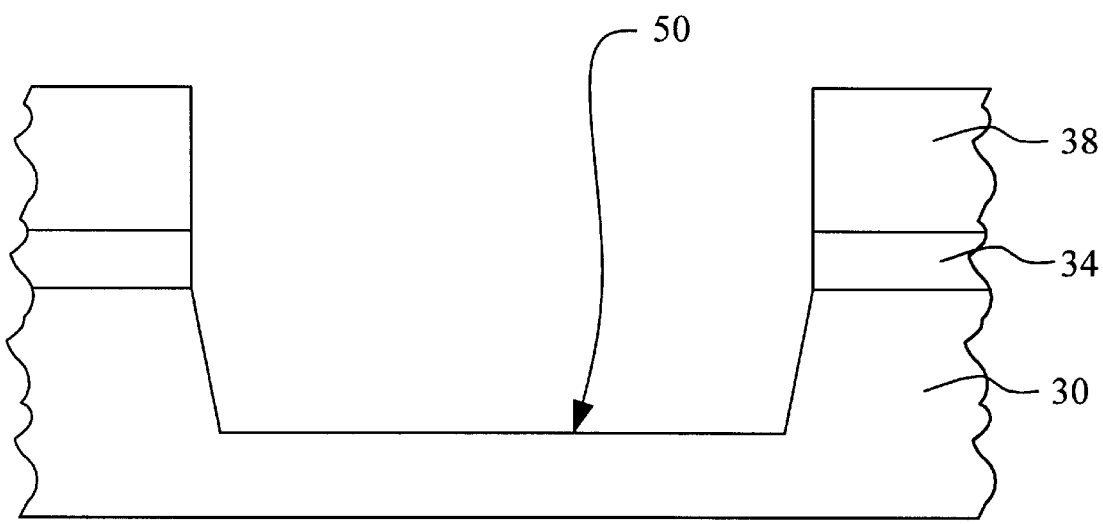

Referring now to FIG. 6, the exposed semiconductor substrate 30 is etched down to form trenches. The trenches are etched to the expected profile 50 and trench cones are eliminated. By damaging the passive surface material 42 prior to the trench etch, the material is easily removed by the etching process. The trench etching process may comprise, for example, a plasma, dry etching process using a chlorine-based or bromine-based chemistry as is well known in the art.

Figure 7:
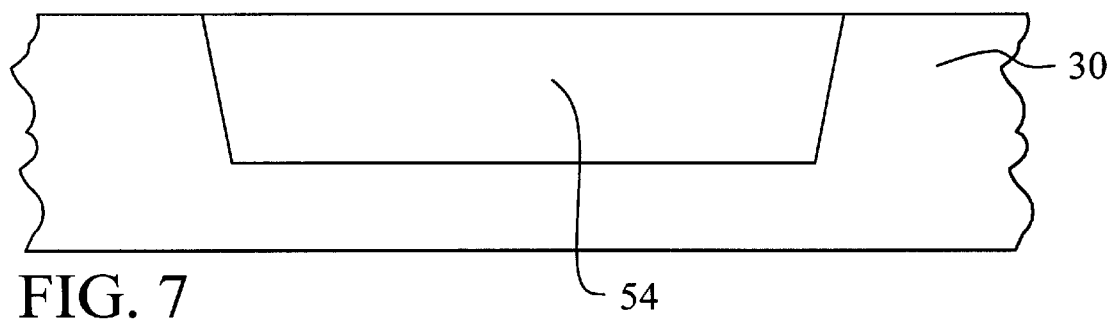

Referring now to FIG. 7, the STI structure is completed. The silicon nitride layer 38 and the silicon dioxide layer 34 may be etched away or may be retained as an etching or polishing stop. A trench filling layer 54 is then deposited overlying the semiconductor substrate 30 and filling the trenches. The trench filling layer 54 comprises a dielectric material, such as silicon dioxide. A polish down process, such as a chemical mechanical polish, is performed to remove excess trench filling layer 54 and to complete the STI in the manufacture of the integrated circuit device.

Experimental data confirms the capability of the method of the present invention to reduce the occurrence of trench cones. An integrated circuit wafer was processed using the novel method of the present invention. Half of the integrated circuit wafer received the ion implantation. A masking layer blocked the implantation from the other half of the wafer. The ion implantation comprised phosphorous ions implanted at a dose of about $2 \times 10^{13}$ atom/cm$^2$ and an energy of about 500 KeV. A KLA scan of the integrated circuit wafer revealed 575 cones on the non-implanted half of the wafer and only 205 cones on the implanted half of the wafer.

The advantages of the process of the present invention can now be enumerated. First, an effective process for reducing trench cone formation has been demonstrated. Second, the novel process, utilizing an ion implantation into the exposed semiconductor substrate where the trenches are planned, damages any passive surface material overlying the semiconductor substrate. Third, damaged passive surface material is easily removed during the etching process to eliminate trench cone formation. Finally, the elimination of these trench cones improves the trench profile and the STI performance.

As shown in the preferred embodiment, the present invention provides a very manufacturable process for fabricating shallow trench isolations, with reduced occurrence of trench cones, in the manufacture of an integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method of reducing trench cone formation in the fabrication of trenches in an integrated circuit device comprising:

provided a silicon nitride layer overlying a semiconductor substrate wherein openings are formed in said silicon nitride layer to expose said semiconductor substrate where trenches are planned;

implanting ions into said exposed semiconductor substrate to damage passive surface materials overlying said semiconductor substrate; and etching down said exposed semiconductor substrate wherein said damaged passive materials are removed and the occurrence of trench cones is thereby reduced.

2. The method according to claim 1 wherein said semiconductor substrate comprises monocrystalline silicon.

3. The method according to claim 1 wherein said step implanting ions comprises implanting an ion species of the group containing: Si, $N_2$, Ar, Ne, Kr, P, As, B, In.

4. The method according to claim 1 wherein said step of implanting ions comprises implanting at a dosage of between about $1 \times 10^{12}$ atoms/cm$^2$ and $1 \times 10^{16}$ atoms/cm$^2$.

5. The method according to claim 1 wherein said step of implanting ions comprises implanting at an energy of between about 1 KeV and 700 KeV.

6. The method according to claim 1 wherein said step of implanting ions comprises implanting at an angle of between about 0 degrees and 45 degrees with respect to the surface of said integrated circuit device.

7. The method according to claim 1 further comprising forming a silicon dioxide layer overlying said semiconductor substrate prior to said step of providing said silicon nitride layer.

8. The method according to claim 1 wherein said trenches comprise trenches for planned shallow trench isolations.

9. A method of forming trenches in the manufacture of an integrated circuit device comprising:

forming a silicon dioxide layer overlying a semiconductor substrate;

depositing a silicon nitride layer overlying said silicon dioxide layer;

patterning said silicon nitride layer and said silicon dioxide layer to expose said semiconductor substrate where trenches are planned;

implanting ions into said exposed semiconductor substrate to damage passive surface materials overlying said semiconductor substrate; and etching down said exposed semiconductor substrate to form trenches wherein said damaged passive materials are removed and the occurrence of trench cones is thereby reduced.

10. The method according to claim 9 wherein said semiconductor substrate comprises monocrystalline silicon.

11. The method according to claim 9 wherein said step implanting ions comprises implanting an ion species of the group containing: Si, $N_2$, Ar, Ne, Kr, P, As, B, In.

12. The method according to claim 9 wherein said step of implanting ions comprises implanting at a dosage of between about $1 \times 10^{12}$ atoms/cm$^2$ and $1 \times 10^{16}$ atoms/cm$^2$.

13. The method according to claim 9 wherein said step of implanting ions comprises implanting at an energy of between about 1 KeV and 700 KeV.

14. The method according to claim 9 wherein said step of implanting ions comprises implanting at an angle of between about 0 degrees and 45 degrees with respect to the surface of said integrated circuit device.

15. The method according to claim 9 further comprising:

depositing a trench filling layer to fill said trenches; and polishing down said trench filling layer to form shallow trench isolations.

16. A method of forming shallow trench isolations in the manufacture of an integrated circuit device comprising:

forming a silicon dioxide layer overlying a semiconductor substrate;

depositing a silicon nitride layer overlying said silicon dioxide layer;

patterning said silicon nitride layer and said silicon dioxide layer to expose said semiconductor substrate where shallow trench isolations are planned;

implanting ions into said exposed semiconductor substrate to damage passive surface materials overlying said semiconductor substrate;

etching down said exposed semiconductor substrate to form trenches wherein said damaged passive materials are removed and the occurrence of trench cones is thereby reduced;

depositing a trench filling layer to fill said trenches; and polishing down said trench filling layer to complete said shallow trench isolations in the manufacture of said integrated circuit device.

17. The method according to claim 16 wherein said step implanting ions comprises implanting an ion species of the group containing: Si, $N_2$, Ar, Ne, Kr, P, As, B, In.

18. The method according to claim 16 wherein said step of implanting ions comprises implanting at a dosage of between about $1 \times 10^{12}$ atoms/cm$^2$ and $1 \times 10^{16}$ atoms/cm$^2$.

19. The method according to claim 16 wherein said step of implanting ions comprises implanting at an energy of between about 1 KeV and 700 KeV.

20. The method according to claim 16 wherein said step of implanting ions comprises implanting at an angle of between about 0 degrees and 45 degrees with respect to the surface of said integrated circuit device.

* * * * *